United States Patent
Uchikoba et al.

(10) Patent No.: US 6,320,229 B1
(45) Date of Patent: Nov. 20, 2001

(54) SEMICONDUCTOR DEVICE

(75) Inventors: Toshitaka Uchikoba, Osaka; Masahiko Sakagami, Kyoto; Akihiro Yamamoto, Shiga, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/301,354

(22) Filed: Apr. 29, 1999

(30) Foreign Application Priority Data

May 18, 1998 (JP) .................................................. 10-134826
Apr. 9, 1999 (JP) .................................................. 11-102344

(51) Int. Cl.[7] .......................... H01L 29/74; H01L 23/62; H01L 31/113
(52) U.S. Cl. .......................... 257/355; 257/360; 257/372; 257/173
(58) Field of Search .................................... 257/355, 358, 257/360–363, 357, 359, 296, 372, 173, 174

(56) References Cited

U.S. PATENT DOCUMENTS

| | | | |
|---|---|---|---|
| Re. 36,024 | * 1/1999 | Ho ......................................... | 257/356 |
| 5,684,321 | * 11/1997 | Okamura .............................. | 257/355 |
| 5,847,430 | * 12/1998 | Hidaka ................................. | 257/355 |
| 5,869,872 | * 2/1999 | Asai et al. ............................ | 257/360 |
| 5,895,958 | * 4/1999 | Miki ..................................... | 257/355 |
| 5,932,917 | * 8/1999 | Miura ................................... | 257/358 |
| 5,932,918 | * 8/1999 | Krakauer .............................. | 257/368 |
| 5,949,109 | * 9/1999 | Shimizu et al. ...................... | 257/355 |
| 5,962,902 | * 10/1999 | Kato ..................................... | 257/372 |
| 5,977,595 | * 11/1999 | Ham ..................................... | 257/358 |
| 6,015,992 | * 1/2000 | Chatterjee et al. ................... | 257/350 |
| 6,034,552 | * 3/2000 | Chang et al. .......................... | 257/83 |
| 6,049,111 | * 4/2000 | Higuchi et al. ...................... | 257/355 |
| 6,169,311 | * 1/2001 | Iwasaki ................................ | 257/358 |
| 6,172,404 | * 1/2001 | Chen et al. ........................... | 257/361 |
| 6,184,557 | * 2/2001 | Poplevine et al. ................... | 257/358 |
| 6,194,764 | * 2/2001 | Gossner et al. ...................... | 257/355 |
| 6,201,290 | * 3/2001 | Yamada et al. ...................... | 257/536 |
| 6,218,740 | * 4/2001 | Brown et al. ........................ | 257/355 |
| 6,249,027 | * 6/2001 | Burr ..................................... | 257/350 |

FOREIGN PATENT DOCUMENTS 05063191    12/1993  (JP) .

* cited by examiner

*Primary Examiner*—Matthew Smith
*Assistant Examiner*—Chuong A Luu
(74) *Attorney, Agent, or Firm*—McDermott, Will & Emery

(57) ABSTRACT

In a semiconductor substrate of a first conductivity type, first and second high-concentration layers of a second conductivity type are formed in spaced relation to each other. A reference voltage is applied to the second high-concentration layer. A conductive layer provides an electrical connection between the first high-concentration layer and an input pad for inputting an input signal to an input circuit or input/output circuit. A first low-concentration layer of the second conductivity type is formed in the region of the semiconductor substrate immediately underlying the first high-concentration layer.

12 Claims, 7 Drawing Sheets

SEMICONDUCTOR DEVICE

BACKGROUND OF THE INVENTION

The present invention relates to a semiconductor device having a protecting circuit for protecting an internal circuit from a surge voltage.

Conventionally, an input circuit or input/output circuit connected to an internal circuit has been provided with a protecting circuit for protecting the gate of, e.g., a MOS transistor composing the internal circuit. The protecting circuit is composed of a resistor, diode, transistor, or the like.

A description will be given below to an example of a conventional protecting circuit with reference to FIG. 7.

As shown in FIG. 7, a p-type semiconductor substrate 1 is formed with first and second n-type high-concentration layers 2 and 3 which extend in spaced relation to each other in parallel with the main surface of the semiconductor substrate. The first and second n-type high-concentration layers 2 and 3 are isolated from each other by a field oxide film 4. An interlayer insulating film 5 is formed over the first and second n-type high-concentration layers 2 and 3. A first metal layer 6 extending in parallel with the first n-type high-concentration layer 2 and a second metal layer 7 extending in parallel with the second n-type high-concentration layer 3 are formed on the interlayer insulating film 5. The first metal layer 6 is connected not only to an input pad INP for inputting a signal to an input circuit or input/output circuit but also to the first n-type high-concentration layer 2 via contacts. The second metal layer 7 has both end portions connected to a reference voltage pad VSP for supplying a reference voltage Vss and has a center portion connected to the second n-type high-concentration layer 3.

A description will be given below to the operation of the conventional protecting circuit.

If a positive surge voltage is applied to the protecting circuit from the input pad INP, a PN junction between the semiconductor substrate 1 and the first n-type high-concentration layer 2 connected to the input pad INP via the first metal layer 6 breaks down, so that holes flow into the p-type semiconductor substrate 1. When the holes flow into the p-type semiconductor substrate 1, a potential at the region of the p-type semiconductor substrate 1 adjacent the first n-type high-concentration layer 2 increases locally. As a result, a parasitic bipolar transistor QP operates to allow a bipolar current to flow between the input pad INP and the reference voltage pad VSP, which allows a surge current to flow to the reference voltage pad VSP.

On the other hand, if a negative surge voltage is applied to the protecting circuit from the input pad INP, the p-type semiconductor substrate 1 and the first n-type high-concentration layer 2 are forward biased. Accordingly, a forward current for a diode flows between the reference voltage pad VSP and the input pad INP, which allows a surge current to flow to the input pad INP.

In accordance with the aforesaid principle of operation, the protecting circuit promptly absorbs the surge voltage to prevent a high voltage from being applied to an internal circuit, so that damage of the internal elements of a semiconductor device is prevented.

However, since the regions of the first n-type high-concentration layer 2 immediately underlying the connection regions between the first metal layer 6 and the first n-type high-concentration layer 2 is low in impedance, if the positive surge voltage is applied to the input pad INP, a breakdown current is localized to the regions of the first n-type high-concentration layer 2 immediately underlying the connection regions between the first metal layer 6 and the first n-type high-concentration layer 2. This raises the possibility of damage of the PN junction between the first n-type high-concentration layer 2 and the p-type semiconductor substrate 1 or damage of the first n-type high-concentration layer 2 itself.

If considerations are given to a current path extending from the connection region between the first n-type high-concentration layer 2 and the first metal layer 6 to the p-type semiconductor substrate 1, the current path is shorter in length in a direction (vertical direction) perpendicular to the connection plane between the first metal layer 6 and the first n-type high-concentration layer 2 than in a direction (lateral direction) parallel to the connection plane, so that the breakdown current flows in large quantity in the direction perpendicular to the connection plane between the first metal layer 6 and the first n-type high-concentration layer 2, while the breakdown current is less likely to flow in the direction parallel to the connection plane. This prevents the parasitic bipolar transistor QP from thoroughly absorbing the surge current.

To enhance the ability of the protecting circuit to absorb the surge current, therefore, the area occupied by the first n-type high-concentration layer 2 should be increased. If the area occupied by the first n-type high-concentration layer 2 is increased, however, an input capacitance or input/output capacitance is increased and a delay time for an input signal or output signal is elongated, which causes the problem of lower operating speed of the internal circuit.

SUMMARY OF THE INVENTION

In view of the foregoing, it is therefore an object of the present invention to enhance the ability to absorb a surge current without enlarging the area occupied by a high-concentration layer electrically connected to an input pad.

To attain the above object, a semiconductor device according to the present invention comprises: a semiconductor substrate of a first conductivity type; a first high-concentration layer of a second conductivity type formed in the semiconductor substrate; a second high-concentration layer of the second conductivity type formed in the semiconductor substrate in spaced relation to the first high-concentration layer, a reference voltage being applied to the second high-concentration layer; a conductive layer for providing an electrical connection between the first high-concentration layer and an input pad for inputting an input signal to an input circuit or to an input/output circuit; and a first low-concentration layer of the second conductivity type formed in a region of the semiconductor substrate immediately underlying the first high-concentration layer.

In the semiconductor device according to the present invention, the first low-concentration layer of the second conductivity type is formed in the region of the semiconductor substrate immediately underlying the first high-concentration layer, so that the impedance of a current path in a direction (vertical direction) perpendicular to the main surface of the semiconductor substrate is increased.

As a result, a breakdown current generated upon the application of a positive surge voltage to the input pad is prevented from being localized to the region immediately underlying the first high-concentration layer, i.e., the current density of the breakdown current flowing through the first high-concentration layer toward the region immediately thereunder is lowered. This prevents damage of the PN junction between the region immediately underlying the first high-concentration layer and the semiconductor substrate and damage of the first high-concentration layer itself.

Moreover, the breakdown current flows in larger quantity through a current path in a direction parallel to the main surface of the semiconductor substrate in the first high-concentration layer than in the conventional embodiment. Accordingly, a bipolar current flowing through a parasitic bipolar transistor formed of the semiconductor substrate, the first high-concentration layer, and the second high-concentration layer is increased, which enhances the ability to absorb the surge current and increases the surge voltage immunity of the semiconductor device.

Preferably, the semiconductor device according to the present invention further comprises a second low-concentration layer of the second conductivity type formed in a region of the semiconductor substrate immediately underlying the second high-concentration layer.

In the arrangement, the opposing area between the first high-concentration and low-concentration layers and the second high-concentration and low-concentration layers is increased, which increases the current capability of the parasitic bipolar transistor and thereby enhances the ability to absorb the surge current.

Preferably, the semiconductor device according to the present invention further comprises: a third high-concentration layer of the second conductivity type formed in a region of the semiconductor substrate on the opposite side of the second high-concentration layer relative to the first high-concentration layer, the reference voltage being applied to the third high-concentration layer; and a third low-concentration layer of the second conductivity type formed in a region of the semiconductor substrate immediately underlying the third high-concentration layer.

In the arrangement, the first parasitic bipolar transistor is composed of the semiconductor substrate, the first high-concentration and low-concentration layers, and the second high-concentration and low-concentration layers, while the second parasitic bipolar transistor is composed of the semiconductor substrate, the first high-concentration and low-concentration layers, and the third high-concentration and low-concentration layers. If a positive surge voltage is applied to the input pad, therefore, the first and second bipolar transistors operate to allow a bipolar current to flow both ways from the first high-concentration and low-concentration layers. This doubles the ability to absorb the surge current and increases the surge voltage immunity of the semiconductor device.

Preferably, the semiconductor device according to the present invention further comprises a high-resistance conductive layer formed between the input pad and the first high-concentration layer to be connected in series with the conductive layer, the high-resistance conductive layer having a resistance value higher than that of the conductive layer.

It follows that, in the arrangement, a resistance component is inserted in series between the input pad and the collector of the parasitic bipolar transistor. This suppresses the surge current flowing into the protecting circuit and more positively prevents damage of the PN junction between the first high-concentration layer and the semiconductor substrate and damage of the first high-concentration layer itself.

In the semiconductor device according to the present invention, the first high-concentration layer preferably has a non-opposing region extending outwardly from a region thereof in opposing relation to the second high-concentration layer, the non-opposing region being electrically connected to the conductive layer.

In the arrangement, the impedance of a current path extending via the connection region between the conductive layer and the non-opposing region of the first high-concentration layer becomes higher than the impedance of a current path extending via the connection region between the conductive layer and the opposing region of the first high-concentration layer. This reduces the quantity of the current flowing through the current path extending via the connection region between the conductive layer and the non-opposing region of the first high-concentration layer and thereby alleviates current localization in the current path. Since the current localization is circumvented, damage of the connection region between the conductive layer and the first high-concentration layer and the breakage of the first high-concentration layer are prevented, whereby the surge voltage immunity of the semiconductor device is increased.

Preferably, the semiconductor device according to the present invention further comprises a fourth high-concentration layer of the first conductivity type formed in a region of the semiconductor substrate surrounding the first and second high-concentration layers, the reference voltage being applied to the fourth high-concentration layer.

In the arrangement, even if a voltage lower than the reference voltage is applied to the input pad and electrons flow into the semiconductor substrate, the electrons that have flown into the semiconductor substrate flow out to the reference voltage side through the high-concentration layer of the first conductivity type. This prevents a potential variation in the semiconductor substrate.

Preferably, the semiconductor device according to the present invention further comprises an impurity diffusion layer of the second conductivity type formed in a region of the semiconductor substrate surrounding the first and second high-concentration layers, a voltage higher than the reference voltage being applied to the impurity diffusion layer.

In the arrangement, even if a voltage lower than the reference voltage is applied to the input pad and electrons flow into the semiconductor substrate, the electrons that have flown into the semiconductor substrate are drawn into the impurity diffusion layer of the second conductivity type and then flow out to the higher-voltage side. This prevents the misoperation of other semiconductor elements.

DETAILED DESCRIPTION OF THE INVENTION

Embodiment 1

A semiconductor device according to a first embodiment of the present invention will be described with reference to FIG. 1.

Figure 1:
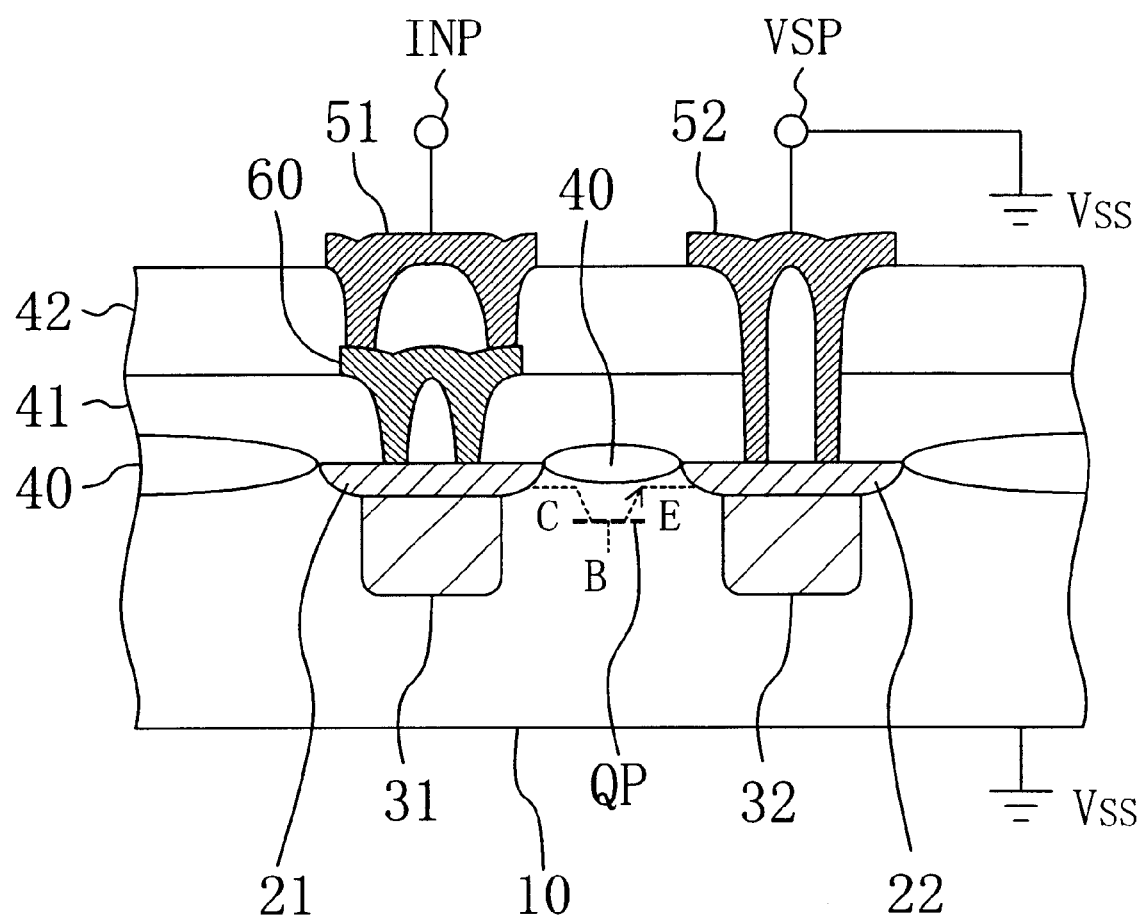
FIG. 1 is a cross-sectional view of a semiconductor device according to a first embodiment.

FIG. 1 shows a cross-sectional structure of the semiconductor device according to the first embodiment. As shown in FIG. 1, a p-type semiconductor substrate 10 connected to a reference voltage Vss is formed with first and second n-type high-concentration layers (diffused regions with high n-type impurity concentration) 21 and 22 which extend in spaced relation to each other in parallel with the main surface of the semiconductor substrate. The p-type semiconductor substrate 10 and the first and second n-type high-concentration layers 21 and 22 constitute a parasitic bipolar transistor QP, in which the p-type semiconductor substrate 10 corresponds to a base: B, the first n-type high-concentration layer 21 corresponds to a collector: C, and the second n-type high-concentration layer 22 corresponds to an emitter: E. The first and second n-type high-concentration layers 21 and 22 can be formed under such implant conditions as implant energy being 20 keV and implant dose being $5 \times 10^{15}$ cm$^2$.

The first embodiment is characterized in that a first n-type low-concentration layer (a diffused region with low n-type impurity concentration) 31 extending in parallel with and slightly narrower in width than the first n-type high-concentration layer 21 is formed in a region immediately underlying the first n-type high-concentration layer 21, while a second n-type low-concentration layer 32 extending in parallel with and slightly narrower in width than the second n-type high-concentration layer 22 is formed in a region immediately underlying the second n-type high-concentration layer 22. The depth of each of the first and second n-type low-concentration layers 31 and 32 ranges from, e.g., 1.5 to 1.75 $\mu$m. The distance between the first and second n-type low-concentration layers 31 and 32 ranges from, e.g., 0.5 to 1.0 $\mu$m. The first and second n-type low-concentration layers 31 and 32 can be formed under such implant conditions as implant energy being 700 keV and implant dose being $1 \times 10^{13}$ cm$^2$.

The first and second n-type high-concentration layers 21 and 22 are isolated from each other and also from other elements by a field oxide film 40. First and second interlayer insulating films 41 and 42 are formed sequentially over the first and second n-type high-concentration layers 21 and 22.

A first metal layer 51 extending in parallel with the first n-type high-concentration layer 21 and a second metal layer 52 extending in parallel with the second n-type high-concentration layer 22 are formed on the second interlayer insulating film 42. The first metal layer 51 has both end portions connected to an input pad INP for outputting an input signal to an input circuit or input/output circuit and has a center portion connected to the first n-type high-concentration layer 21 via a high-resistance conductive layer 60 formed on the first interlayer insulating film 41 to extend in parallel with the first metal layer 51. The second metal layer 52 has both end portions connected to a reference voltage pad VSP for supplying the reference voltage Vss and has a center portion connected to the second n-type high-concentration layer 52. In this case, the resistance of the high-resistance conductive layer 60 has been set to a value slightly higher than the resistance of each of the first and second metal layers 51 and 52.

According to the first embodiment, the first n-type low-concentration layer 31 is formed in the region of the p-type semiconductor substrate 10 immediately underlying the connection regions between the high-resistance conductive layer 60 and the first n-type high-concentration layer 21, so that the impedance of a current path is increased in a direction (vertical direction) perpendicular to the connection plane between the high-resistance conductive layer 60 and the first n-type high-concentration layer 21.

As a result, a breakdown current generated upon the application of a positive surge voltage to the input pad INP is prevented from being localized to the region of the first n-type high-concentration layer 21 immediately underlying the connection region between the first n-type high-concentration layer 21 and the high-resistance conductive layer 60. In other words, the current density of the breakdown current flowing through the first n-type high-concentration layer 21 is lowered, which prevents damage of the PN junction between the region immediately underlying the first n-type high-concentration layer 21 and the p-type semiconductor substrate 10 and damage of the first n-type high-concentration layer 21 itself.

Moreover, the breakdown current flowing through the current path in a direction (lateral direction) parallel to the connection plane between the high-resistance conductive layer 60 and the first n-type high-concentration layer 21 in the first n-type high-concentration layer 21 is larger in quantity than in the conventional embodiment. This increases a bipolar current flowing through the parasitic bipolar transistor QP and thereby enhances the ability of a protecting circuit to absorb the surge current as well as the surge voltage immunity of the semiconductor device.

According to the first embodiment, the second n-type low-concentration layer 32 is formed in the region of the p-type semiconductor substrate 10 immediately underlying the connection regions between the second metal layer 52 and the second n-type high-concentration layer 22 in opposing relation to the first n-type low-concentration layer 31, resulting in an increased opposing area between the first n-type high-concentration and low-concentration layers 21 and 31 and the second n-type high-concentration and low-concentration layers 22 and 32. This increases the current capability of the parasitic bipolar transistor QP and thereby enhances the ability of the protecting circuit to absorb the surge current.

Figure 2:
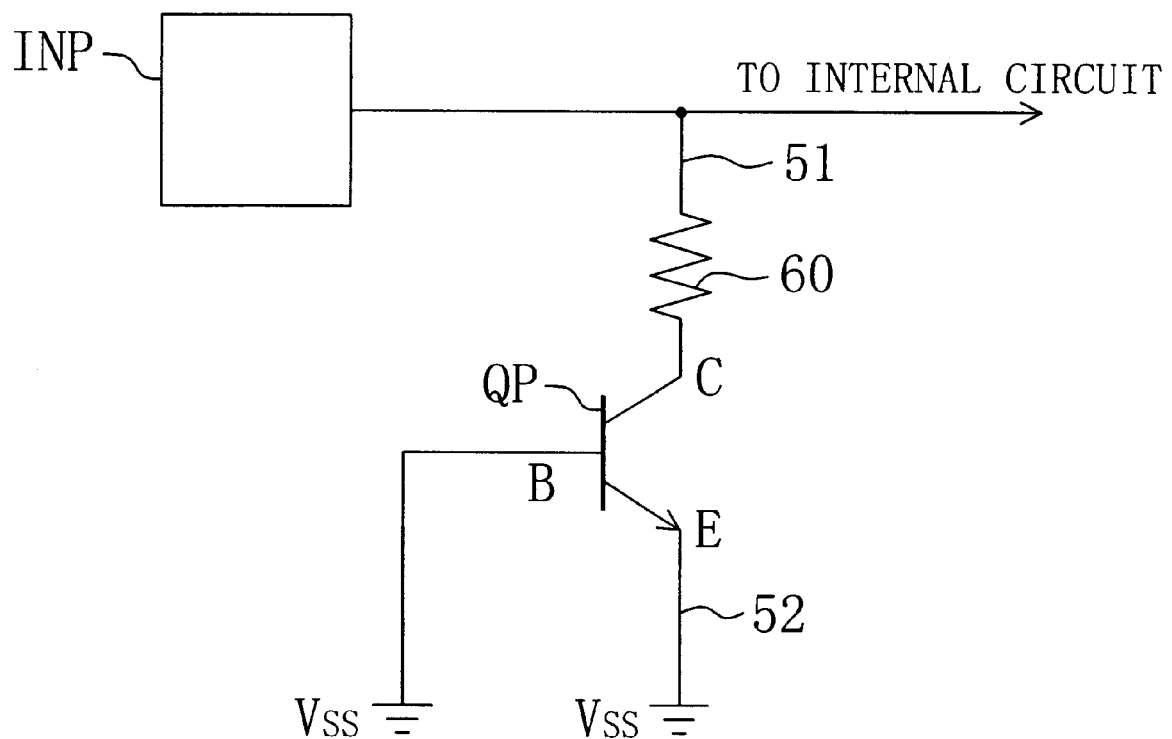
FIG. 2 is an equivalent circuit diagram of a protecting circuit which is implemented by the semiconductor device according to the first embodiment.

Since the high-resistance conductive layer 60 is disposed between the first metal layer 51 and the first n-type high-concentration layer 21 according to the first embodiment, it follows that the resistance component of the high-resistance conductive layer 60 is inserted in series between the input pad INP and the collector C of the bipolar transistor QP, as shown in the equivalent circuit of FIG. 2. This suppresses the surge current flowing into the protecting circuit and more positively prevents damage of the PN junction between the first n-type high-concentration layer 21 and the p-type semiconductor substrate 10 and damage of the first n-type high-concentration layer 21 itself.

Embodiment 2

Below, a protecting circuit according to a second embodiment of the present invention will be described with reference to FIGS. 3 and 4. In the second embodiment, the description of the same members as used in the first embodiment will be omitted by designating them by similar reference numerals.

Figure 3:
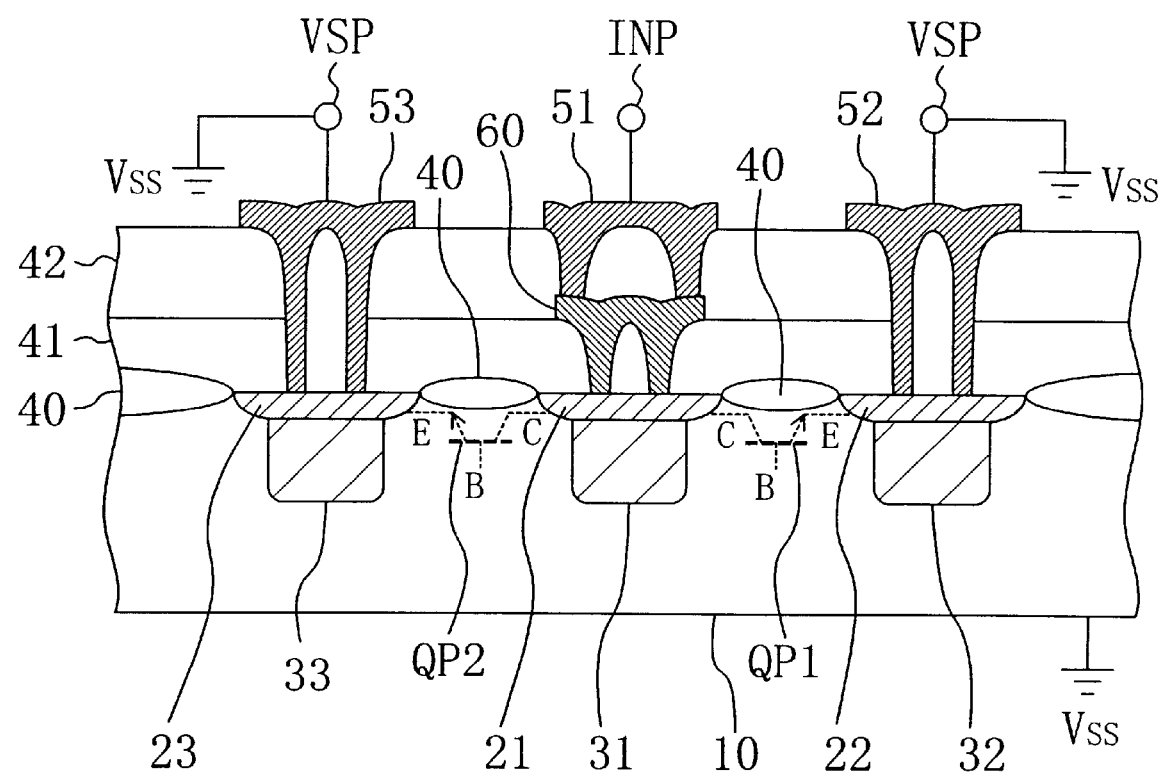
FIG. 3 is a cross-sectional view of a semiconductor device according to a second embodiment, which has been taken along the line III—III of FIG. 4.

FIG. 3 shows a cross-sectional structure of a semiconductor device according to the second embodiment. FIG. 4 shows a plan structure of the semiconductor device according to the second embodiment. FIG. 3 is a cross-sectional view taken along the line III—III of FIG. 4.

As shown in FIG. 3, a p-type semiconductor substrate 10 connected to a reference voltage Vss is formed with a first n-type high-concentration layer 21 and with second and third n-type high-concentration layers 22 and 23 located on both sides of the first n-type high-concentration layer 21. A first metal layer 51, a second metal layer 52, and a third metal layer 53 are formed on a second interlayer insulating film 42. The first metal layer 51 has both end portions connected to an input pad INP for outputting an input signal to an input circuit or input/output circuit and has a center portion connected to the first n-type high-concentration layer 21 via a high-resistance conductive layer 60. The second metal layer 52 has both end portions connected to a reference voltage pad VSP for supplying the reference voltage Vss and has a center portion connected to the second n-type high-concentration layer 22. The third metal layer 53 has both end portions connected to a reference voltage pad VSP for supplying the reference voltage Vss and has a center portion connected to the third n-type high-concentration layer 23.

According to the second embodiment, a second diode composed of the p-type semiconductor substrate 10, the second n-type high-concentration layer 22, and a second n-type low-concentration layer 32 and a third diode composed of the p-type semiconductor substrate 10, the third n-type high-concentration layer 23, and a third n-type low-concentration layer 33 are formed on both sides of a first diode composed of the p-type semiconductor substrate 10, the first n-type high-concentration layer 21, and a first n-type low-concentration layer 31. Consequently, the p-type semiconductor substrate 10, the first n-type high-concentration and low-concentration layers 21 and 31, and the second n-type high-concentration and low-concentration layers 22 and 32 constitute a first parasitic bipolar transistor QP1, while the p-type semiconductor substrate 10, the first n-type high-concentration and low-concentration layers 21 and 31, and the third n-type high-concentration and low-concentration layers 23 and 33 constitute a second parasitic bipolar transistor QP2. If a positive surge voltage is applied to the input pad INP, the first and second parasitic bipolar transistors QP1 and QP2 operate to allow a bipolar current to flow between the input pad INP and each of the reference voltage pads VSP on both sides thereof, so that the surge current is allowed to flow to the reference voltage pads VSP on both sides. This doubles the ability of the protecting circuit to absorb the surge current and thereby greatly increases the surge voltage immunity of the semiconductor device.

It is to be noted that the input capacitance of the protecting circuit is determined by the junction capacitance of the PN junction of the diode connected to the input pad INP, i.e., the first diode composed of the p-type semiconductor substrate 10, the first n-type high-concentration layer 21, and the first n-type low-concentration layer 31. Therefore, if the second and third diodes are disposed on both sides of the first diode, the input capacitance is not increased so that there is no possibility of lowering the circuit operating speed of the device.

Figure 4:
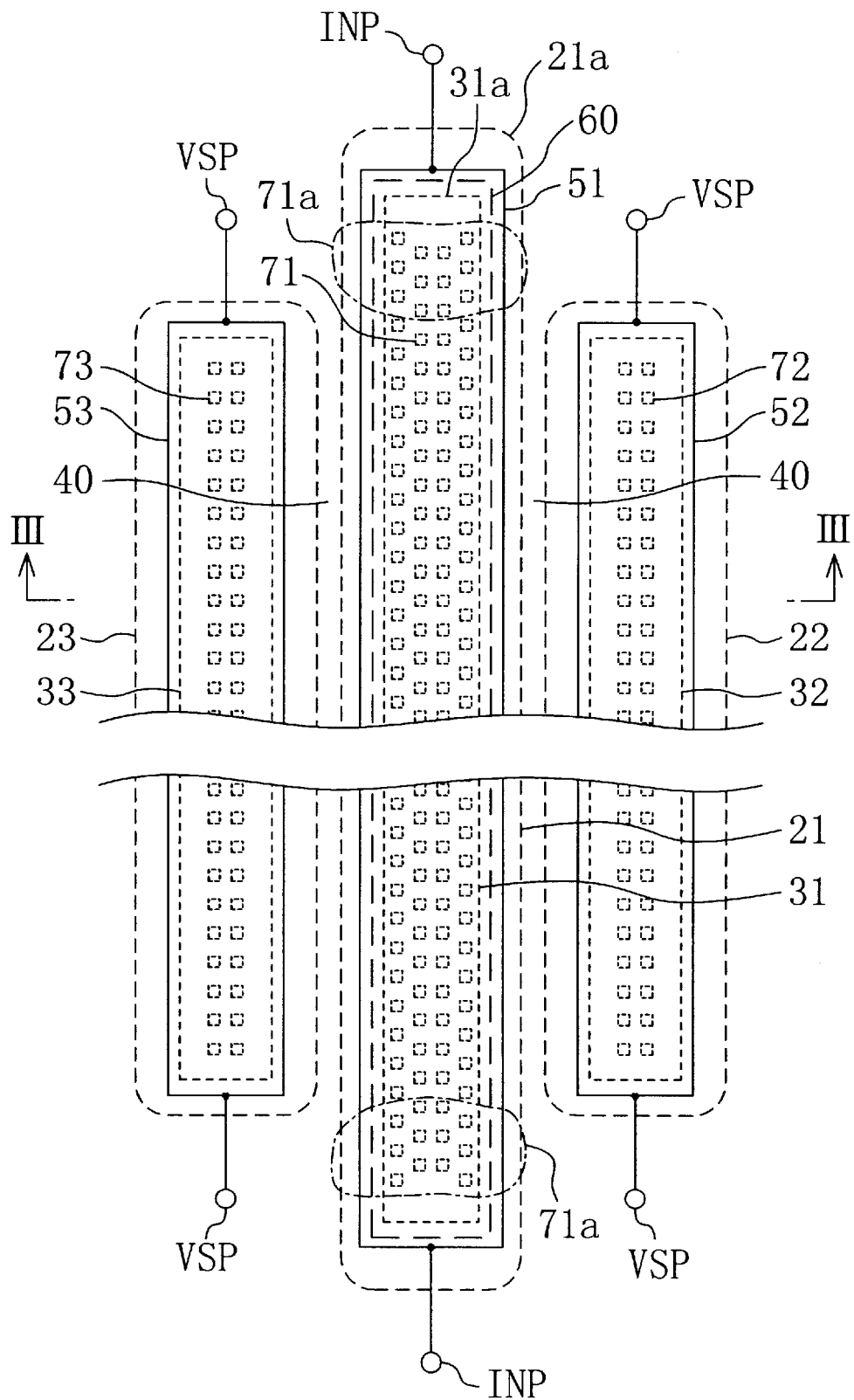
FIG. 4 is a plan view of the semiconductor device according to the second embodiment.

As shown in FIG. 4, the first n-type high-concentration layer 21 extends both ways beyond the respective ends of the second and third high-concentration layers 22 and 23 to have non-opposing regions 21a which are in non-opposing relation to the second and third n-type high-concentration layers 22 and 23, while the first n-type low-concentration layer 31 extends both ways beyond the respective ends of the second and third low-concentration layers 32 and 33 to have non-opposing regions 31a which are in non-opposing relation to the second and third n-type low-concentration layers 32 and 33. A first contact 71 for providing a connection between the first n-type high-concentration layer 21 and the high-resistance conductive layer 60 (first metal layer 51) is formed also in the non-opposing regions 21a of the first n-type high-concentration layer 21.

In FIG. 4, 71a denotes the non-opposing-region contact formed on each of the non-opposing regions 21a of the first n-type high-concentration layer 21, 72 denotes a second contact for providing a connection between the second n-type high-concentration layer 22 and a second metal layer 52, and 73 denotes a third contact for providing a connection between the third n-type high-concentration layer 23 and a third metal layer 53.

As stated previously, the second n-type high-concentration layer 22 and the third n-type high-concentration layer 23 are not present on either side of the non-opposing-region contact 71a. Consequently, the distances from the connection regions between the first n-type high-concentration layer 21 and the non-opposing-region contacts 71a to the second and third n-type high-concentration layers 22 and 23 (corresponding to the lengths of the bases of the first and second parasitic bipolar transistors QP1 and QP2) are larger than the distances from the connection regions between the first n-type high-concentration layer 21 and the first contact 71 located on the center portion of the first n-type high-concentration layer 21 to the second and third n-type high-concentration layers 22 and 23. Accordingly, the impedance of a current path extending via the non-opposing-region contacts 71a becomes higher than the impedance of a current path extending via the first contact 71 located on the center portion, which suppresses the quantity of the current flowing through the current path extending via the non-opposing-region contact 71a.

It is to be noted that the path of the current flowing from any one of the first contacts 71 formed on the edge portion of the first n-type high-concentration layer 21 to the edge portion of the second or third n-type high-concentration layer 22 or 23 expands to a region exterior to the first, second, and third n-type high-concentration layers 21, 22, and 23. If the first n-type high-concentration layer 21 has the same length as the second and third n-type high-concentration layers 22 and 23, therefore, the quantity of the current flowing from the first contact 71 formed on the edge portion of the first n-type high-concentration layer 21 to the edge portion of the second or third n-type high-concentration layer 22 or 23 is larger than the quantity of the current flowing from any of the first contact 71 formed on the center portion of the first n-type high-concentration layer 21 to the center portion of the second or third n-type high-concentration layer 22 or 23 because of the current path expanding to the region exterior to the first, second, and third n-type high-concentration layers 21, 22, and 23, so that current localization occurs in the current path extending through the first contact 71 formed on the edge portion of the first n-type high-concentration layer 21.

According to the second embodiment, however, the impedance of the current path extending via the non-opposing-region contact 71a becomes higher than the impedance of the current path extending via the first contact 71 located on the center portion, as described above. This suppresses the quantity of the current flowing through the current path extending via the non-opposing-region contact 71a and thereby alleviates the current localization in the current path extending via the non-opposing-region contact 71a. Since the current localization is circumvented, damage of the first contact 71 and the n-type high-concentration layer 21 is prevented and the surge voltage immunity of the protecting circuit is increased.

Although the second embodiment has disposed the second and third n-type high-concentration layers 22 and 23 on both sides of the first n-type high-concentration layer 21 to form the second and third diodes on both sides of the first diode, it is also possible to alternately dispose an n-type high-concentration layer connected to the input signal pad INP and n-type high-concentration layers each connected to the reference voltage pad VSP. In the arrangement, parasitic bipolar transistors are formed on both sides of the n-type high-concentration layer connected to the input signal pad INP, which positively enhances the ability to absorb the surge current.

Embodiment 3

Below, a protecting circuit according to a third embodiment of the present invention will be described with reference to FIGS. 5 and 6. In the third embodiment, the description of the same members as used in the first or second embodiment will be omitted by designating them by similar reference numerals.

Figure 5:
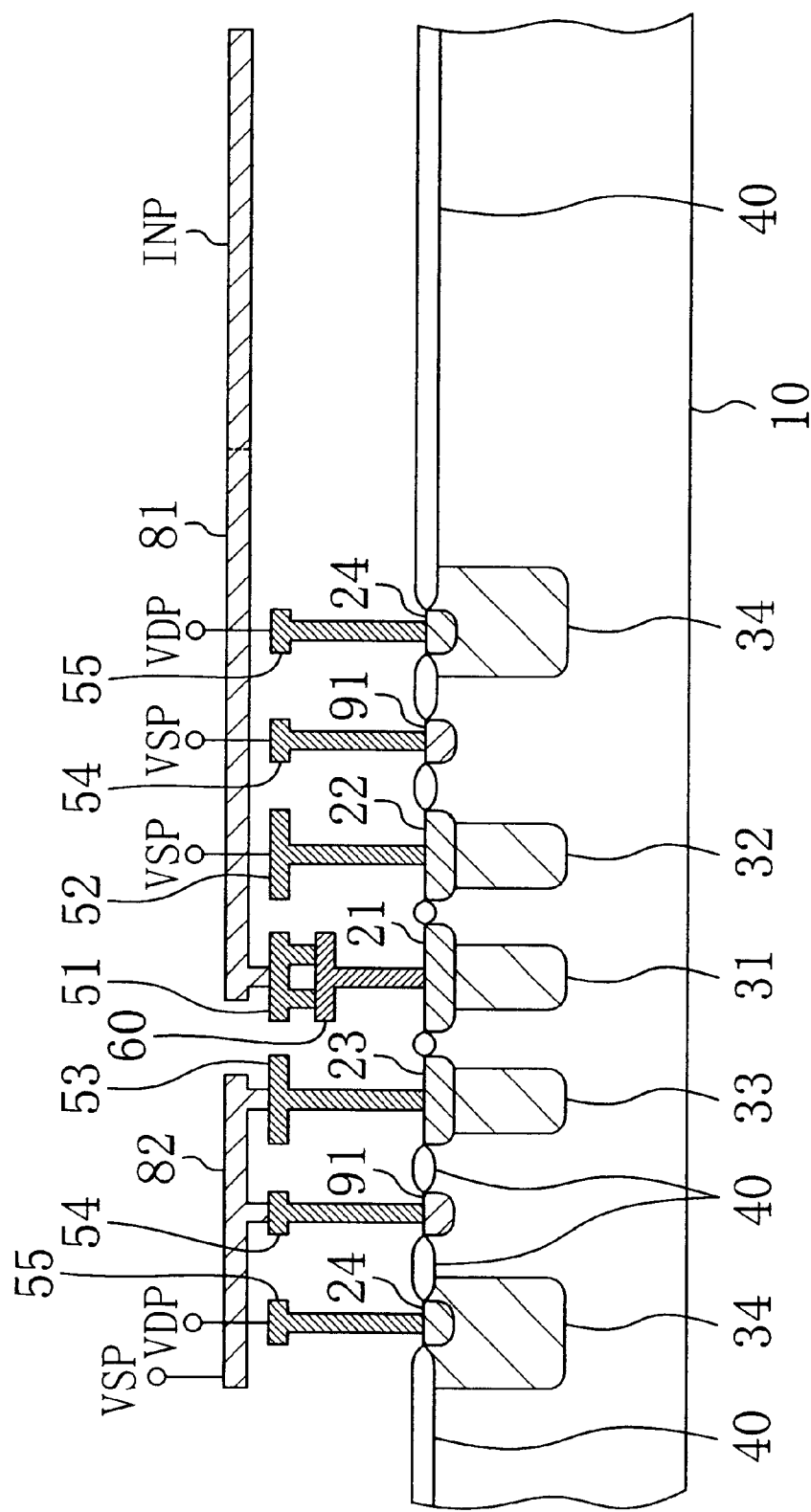
FIG. 5 is a cross-sectional view of a semiconductor device according to a third embodiment, which has been taken along the line V—V of FIG. 6.
Figure 6:
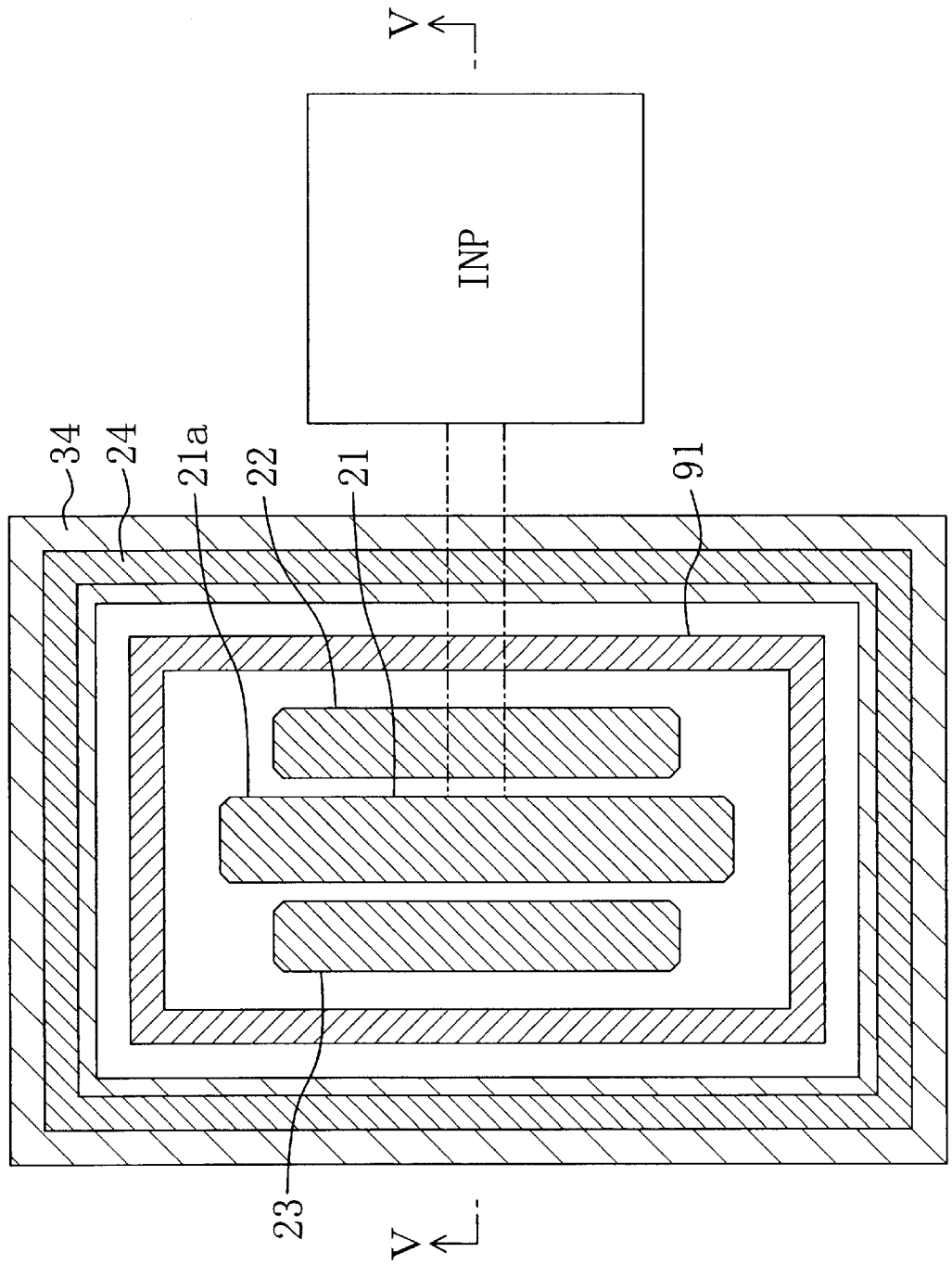
FIG. 6 is a plan view of the semiconductor device according to the third embodiment.
Figure 7:
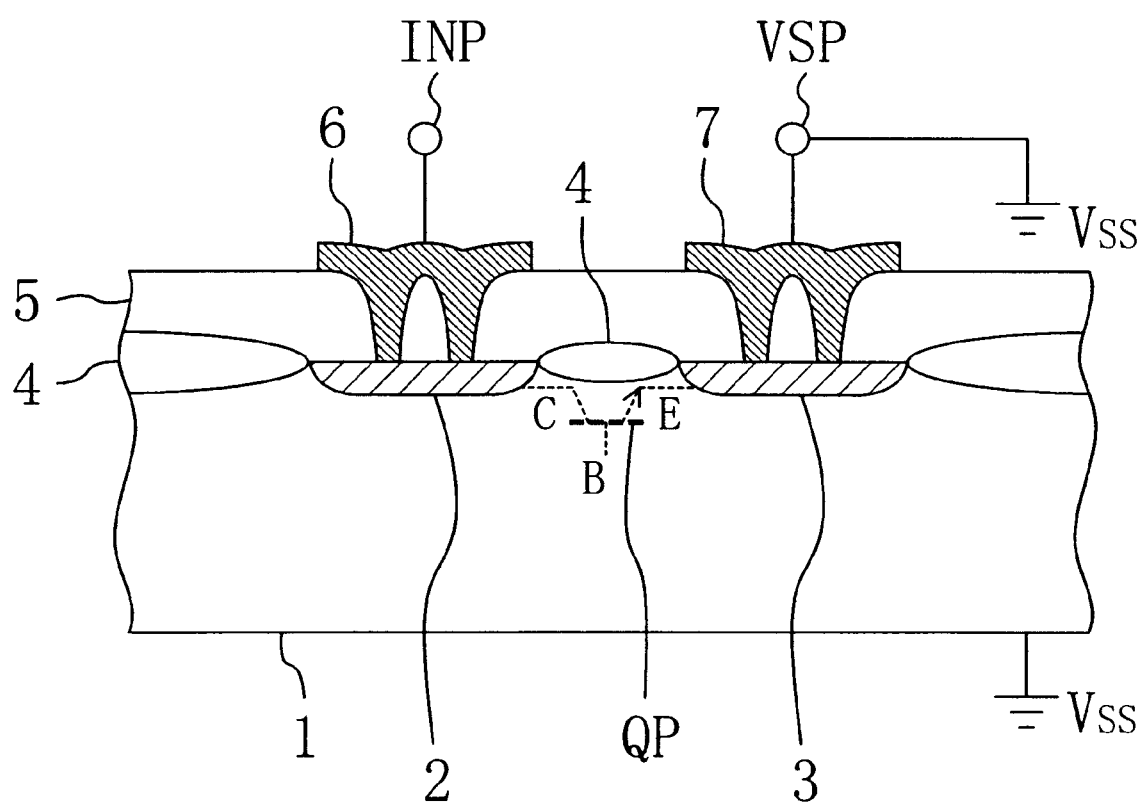
FIG. 7 is a cross-sectional view of a conventional semiconductor device.

FIG. 5 shows a cross-sectional structure of a semiconductor device according to the third embodiment. FIG. 6 shows a plan structure of the semiconductor device according to the second embodiment. FIG. 5 is a cross-sectional view taken along the line V—V of FIG. 6.

As shown in FIG. 5, a p-type semiconductor substrate 10 connected to a reference voltage Vss is formed with a first n-type high-concentration layer 21 and with second and third n-type high-concentration layers 22 and 23 located on both sides of the first n-type high-concentration layer 21, similarly to the second embodiment. A first metal layer 51 has both end portions connected to an input pad INP and has a center portion connected to the first n-type high-concentration layer 21 via a high-resistance conductive layer 60. A second metal layer 52 has both end portions connected to a reference voltage pad VSP and has a center portion connected to the third n-type high-concentration layer 23. The first metal layer 51 and the input pad INP are connected to each other by a first metal wire 81, while the third metal layer 53 and the reference voltage pad VSP are connected to each other by a second metal wire 82. Although the second metal layer 52 and the reference voltage pad VSP are connected to each other by the second metal wire 82, the drawing thereof is omitted here.

The third embodiment is characterized in that a p-type high-concentration layer 91 configured as a square frame is formed in the p-type semiconductor substrate 10 to surround the first, second, and third n-type high-concentration layers 21, 22, and 23 and that a fourth metal layer 54 is formed on the p-type high-concentration layer 91 and connected to the reference voltage pad VSP via the second metal wire 82.

Moreover, a fourth n-type high-concentration layer 24 configured as a square frame is formed external to the p-type high-concentration layer 91 and a fifth metal layer 55 is formed on the fourth n-type high-concentration layer 24. The fifth metal layer 55 provides an electrical connection between the fourth n-type high-concentration layer 24 and a high potential pad VDP to which a voltage higher than the reference voltage Vss, e.g., a power source voltage Vdd is applied.

If a voltage lower than the reference voltage Vss is applied from an input circuit or input/output circuit to the input pad INP, electrons flow from the first n-type high-concentration layer 21 or from the first n-type low-concentration layer 31 into the p-type semiconductor substrate 10. When the electrons flow into the p-type semiconductor substrate 10, the potential at the p-type semiconductor substrate 10 may vary, while the electrons that have flown into the p-type semiconductor substrate 10 may be diffused into another semiconductor element formed in the p-type semiconductor substrate 10 and cause the misoperation of the other semiconductor element.

In the third embodiment, however, the p-type high-concentration layer 91 is formed to surround the first, second, and third n-type high-concentration layers 21, 22, and 23 and connected to the substrate voltage, in this case the reference voltage pad VSP, so that the electrons flown into the p-type semiconductor substrate 10 flow out to the reference voltage pad VSP via the p-type high-concentration layer 91. This can prevent a potential variation in the p-type semiconductor substrate 10 even if a voltage lower than the reference voltage Vss is applied to the input pad INP.

Moreover, the third embodiment has disposed the fourth n-type high-concentration layer 24 connected to the high-potential pad VDP to which a voltage higher than the reference voltage Vss is applied and a fourth n-type low-concentration layer 34 external to the p-type high-concentration layer 91. Consequently, the electrons flown into the p-type semiconductor substrate 10 penetrate a depletion layer formed adjacent the fourth n-type high-concentration layer 24 or the fourth n-type low-concentration layer 34 to be drawn to the fourth n-type high-concentration layer 24 or the fourth n-type low-concentration layer 34 and then flow out to the high potential pad VDP. This prevents the misoperation of another semiconductor element even if a voltage lower than the reference voltage Vss is applied to the input pad INP. In this case, the fourth n-type low-concentration layer 34 preferably has a depth equal to or larger than the depth of the first n-type low-concentration layer 31 in order that the electrons flown from the first n-type low-concentration layer 31 into the p-type semiconductor substrate 10 are surely drawn into the fourth n-type low-concentration layer 34.

Although the third embodiment has disposed the fourth n-type high-concentration layer 24 and the fourth n-type low-concentration layer 34 external to the p-type high-concentration layer 91, it is also possible to dispose only the fourth n-type high-concentration layer 24 or the fourth low-concentration layer 34 instead. In this case also, the fourth n-type high-concentration layer 24 or the fourth n-type low-concentration layer 34 preferably has a depth equal to or higher than the depth of the first n-type low-concentration layer 31.

Since the p-type high-concentration layer 91 and the fourth n-type high-concentration and low-concentration layers 24 and 34 can independently exert their respective functions, either the p-type high-concentration layer 91 or the fourth n-type high-concentration and low-concentration layers 24 and 34 may be disposed appropriately.

Although each of the first and third embodiments has disposed the high-resistance conductive layer 60 between the first n-type high-concentration layer 21 and the first metal layer 51, the position at which the high-resistance conductive layer 60 is disposed is not particularly limited provided that the high-resistance conductive layer 60 is connected in series with the first metal layer 51 between the input pad INP and the first n-type high-concentration layer 21. Alternatively, the first n-type high-concentration layer 21 may be connected directly to the first metal layer 51 without the provision of the high-resistance conductive layer 60.

Although each of the first to third embodiments has provided the p-type semiconductor substrate 10 with the first and second n-type high-concentration layers 21 and 22 (or the third n-type high-concentration layer 23) and with the first and second n-type low-concentration layers 31 and 32 (or the third n-type low-concentration layer 23), it is also possible to provide an n-type semiconductor substrate with first and second p-type high-concentration layers (or a third p-type high-concentration layer) and with first and second p-type low-concentration layers (or a third p-type low-concentration layer).

What is claimed is:

1. A semiconductor device comprising:
    a semiconductor substrate of a first conductivity type;
    a first high-concentration layer of a second conductivity type formed in said semiconductor substrate;
    a second high-concentration layer of the second conductivity type formed in said semiconductor substrate in spaced relation to said first high-concentration layer, a reference voltage being applied to said second high-concentration layer;
    a conductive layer for providing an electrical connection between said first high-concentration layer and an input pad for inputting an input signal to an input circuit or to an input/output circuit;
    a first low-concentration layer of the second conductivity type formed in a region of said semiconductor substrate immediately underlying said first high-concentration layer; and
    a high-resistance conductive layer formed between said input pad and said first high-concentration layer to be connected in series with said conductive layer, said high-resistance conductive layer having a resistance value higher than that of said conductive layer.

2. The semiconductor device according to claim 1, further comprising a second low-concentration layer of the second conductivity type formed in a region of said semiconductor substrate immediately underlying said second high-concentration layer.

3. The semiconductor device according to claim 2, further comprising:
    a third high-concentration layer of the second conductivity type formed in a region of said semiconductor substrate on the opposite side of said second high-concentration layer relative to said first high-concentration layer, the reference voltage being applied to said third high-concentration layer; and
    a third low-concentration layer of the second conductivity type formed in a region of said semiconductor substrate immediately underlying said third high-concentration layer.

4. The semiconductor device according to claim 1, further comprising an impurity diffusion layer of the second conductivity type formed in a region of said semiconductor substrate surrounding said first and second high-concentration layers, a voltage higher than the reference voltage being applied to said impurity diffusion layer.

5. A semiconductor device comprising:
    a semiconductor substrate of a first conductivity type;
    a first high-concentration layer of a second conductivity type formed in said semiconductor substrate;
    a second high-concentration layer of the second conductivity type formed in said semiconductor substrate in spaced relation to said first high-concentration layer, a reference voltage being applied to said second high-concentration layer;
    a conductive layer for providing an electrical connection between said first high-concentration layer and an input pad for inputting an input signal to an input circuit or to an input/output circuit; and
    a first low-concentration layer of the second conductivity type formed in a region of said semiconductor substrate immediately underlying said first high-concentration layer,
    wherein said first high-concentration layer has a non-opposing region extending outwardly from a region thereof in opposing relation to said second high-concentration layer, said non-opposing region being electrically connected to said conductive layer.

6. The semiconductor device according to claim 5, further comprising a second low-concentration layer of the second conductivity type formed in a region of said semiconductor substrate immediately underlying said second high-concentration layer.

7. The semiconductor device according to claim 6, further comprising:
    a third high-concentration layer of the second conductivity type formed in a region of said semiconductor substrate on the opposite side of said second high-concentration layer relative to said first high-concentration layer, the reference voltage being applied to said third high-concentration layer; and
    a third low-concentration layer of the second conductivity type formed in a region of said semiconductor substrate immediately underlying said third high-concentration layer.

8. The semiconductor device according to claim 5, further comprising an impurity diffusion layer of the second conductivity type formed in a region of said semiconductor substrate surrounding said first and second high-concentration layers, a voltage higher than the reference voltage being applied to said impurity diffusion layer.

9. A semiconductor device comprising:
    a semiconductor substrate of a first conductivity type;
    a first high-concentration layer of a second conductivity type formed in said semiconductor substrate;
    a second high-concentration layer of the second conductivity type formed in said semiconductor substrate in spaced relation to said first high-concentration layer, a reference voltage being applied to said second high-concentration layer;
    a conductive layer for providing an electrical connection between said first high-concentration layer and an input pad for inputting an input signal to an input circuit or to an input/output circuit;
    a first low-concentration layer of the second conductivity type formed in a region of said semiconductor substrate immediately underlying said first high-concentration layer; and
    a fourth high-concentration layer of the first conductivity type formed in a region of said semiconductor substrate surrounding said first and second high-concentration layers, a reference voltage being applied to said fourth high-concentration layer.

10. The semiconductor device according to claim 9, further comprising a second low-concentration layer of the second conductivity type formed in a region of said semiconductor substrate immediately underlying said second high-concentration layer.

11. The semiconductor device according to claim 10, further comprising:
    a third high-concentration layer of the second conductivity type formed in a region of said semiconductor substrate on the opposite side of said second high-concentration layer relative to said first high-concentration layer, the reference voltage being applied to said third high-concentration layer; and a third low-concentration layer of the second conductivity type formed in a region of said semiconductor substrate immediately underlying said third high-concentration layer.

12. The semiconductor device according to claim 9, further comprising an impurity diffusion layer of the second conductivity type formed in a region of said semiconductor substrate surrounding said first and second high-concentration layers, a voltage higher than the reference voltage being applied to said impurity diffusion layer.

* * * * *